United States Patent
Tan et al.

(10) Patent No.: US 12,057,939 B2
(45) Date of Patent: Aug. 6, 2024

(54) XOR FORWARD ERROR CORRECTION FOR ISOLATED AND BURST LOSSES OVER A SOFTWARE-DEFINED-WIDE AREA NETWORK

(71) Applicant: Cisco Technology, Inc., San Jose, CA (US)

(72) Inventors: Wai-Tian Tan, Sunnyvale, CA (US); Xiaoqing Zhu, Austin, TX (US); John G. Apostolopoulos, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 183 days.

(21) Appl. No.: 16/901,947

(22) Filed: Jun. 15, 2020

(65) Prior Publication Data

US 2020/0412483 A1 Dec. 31, 2020

Related U.S. Application Data

(60) Provisional application No. 62/866,546, filed on Jun. 25, 2019.

(51) Int. Cl.
*H04L 1/00* (2006.01)
*H03M 13/03* (2006.01)

(52) U.S. Cl.
CPC .......... *H04L 1/0076* (2013.01); *H03M 13/03* (2013.01); *H04L 1/0041* (2013.01); *H04L 1/0045* (2013.01); *H04L 1/0083* (2013.01)

(58) Field of Classification Search
CPC ... H04L 1/0076; H04L 1/0083; H04L 1/0045; H04L 1/0041; H03M 13/03
See application file for complete search history.

(56) References Cited

U.S. PATENT DOCUMENTS

| | | | |
|---|---|---|---|
| 6,243,846 B1 * | 6/2001 | Schuster | H03M 13/373 714/776 |
| 9,843,413 B2 | 12/2017 | Badr et al. | |
| 10,063,261 B1 * | 8/2018 | Croxall, II | H04L 1/0041 |
| 2002/0080802 A1 * | 6/2002 | Sachs | H04L 1/1621 370/329 |
| 2002/0194526 A1 * | 12/2002 | Ulrich | G06F 11/1076 714/E11.034 |
| 2018/0205394 A1 | 7/2018 | Zhu et al. | |

OTHER PUBLICATIONS

Callstats; "How to recover Lost Media Packets in WebRTC using Forward Error Correction."Nov. 9, 2016. <https://www.callstats.io/blog/2016/11/09/how-to-recover-lost-media-packets-in-webrtc-with-fec> (Year: 2016).*

* cited by examiner

Primary Examiner — Elton Williams
(74) Attorney, Agent, or Firm — Patterson + Sheridan, LLP

(57) ABSTRACT

A method for encoding a sequence of packets includes receiving the sequence of packets, generating a parity packet for a first group of packets within the sequence of packets, and transmitting the first group of packets and the parity packet. The parity packet is generated by performing an exclusive OR (XOR) operation over a plurality of packets in the first group of packets and at least one packet in a second group of packets. The second group is separated from the first group in the sequence by one or more packets.

20 Claims, 10 Drawing Sheets

XOR FORWARD ERROR CORRECTION FOR ISOLATED AND BURST LOSSES OVER A SOFTWARE-DEFINED-WIDE AREA NETWORK

CROSS-REFERENCE TO RELATED APPLICATIONS

This application claims benefit of U.S. provisional patent application Ser. No. 62/866,546, filed 25 Jun. 2019. The aforementioned related patent application is herein incorporated by reference in its entirety.

TECHNICAL FIELD

Embodiments presented in this disclosure generally relate to techniques for forward error correction. More specifically, embodiments disclosed herein relate to improved forward error correction techniques for communications over software-defined wide area networks.

BACKGROUND

Networks generally may be configured from a variety of network elements, such as routers, switches, access points, and the like. In some cases, these network elements may be organized in a hierarchical manner, in which a central network entity in a software defined network (SDN) provisions and manages other network entities in the network. In provisioning and managing other network entities in the network, the central network entity may include various analytic tools that ingest and analyze data in real-time to facilitate network management and performance management.

SDN technology may be applied to various types of communication networks. Software-defined wide area network (SD-WAN or SDWAN), for example, is generally the application of SDN technology applied to wide area network (WAN) connections, such as broadband internet, cellular communications (e.g., 4G, LTE, etc.), or Multiprotocol Label Switching (MPLS). SD-WAN presents unique challenges and opportunities for the design of forward error correction (FEC) codes. For example, using FEC over SD-WAN can be more efficient and achieve lower latency per application stream (e.g., by jointly protecting across many streams), compared to using FEC over other communication technologies. However, one challenge with using FEC over SD-WAN is that FEC encoding and decoding generally have to operate at line speed (e.g., there should be a low decoding delay or latency) with limited computation budget per packet (e.g., allowing only binary XOR operations for encoding/decoding).

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
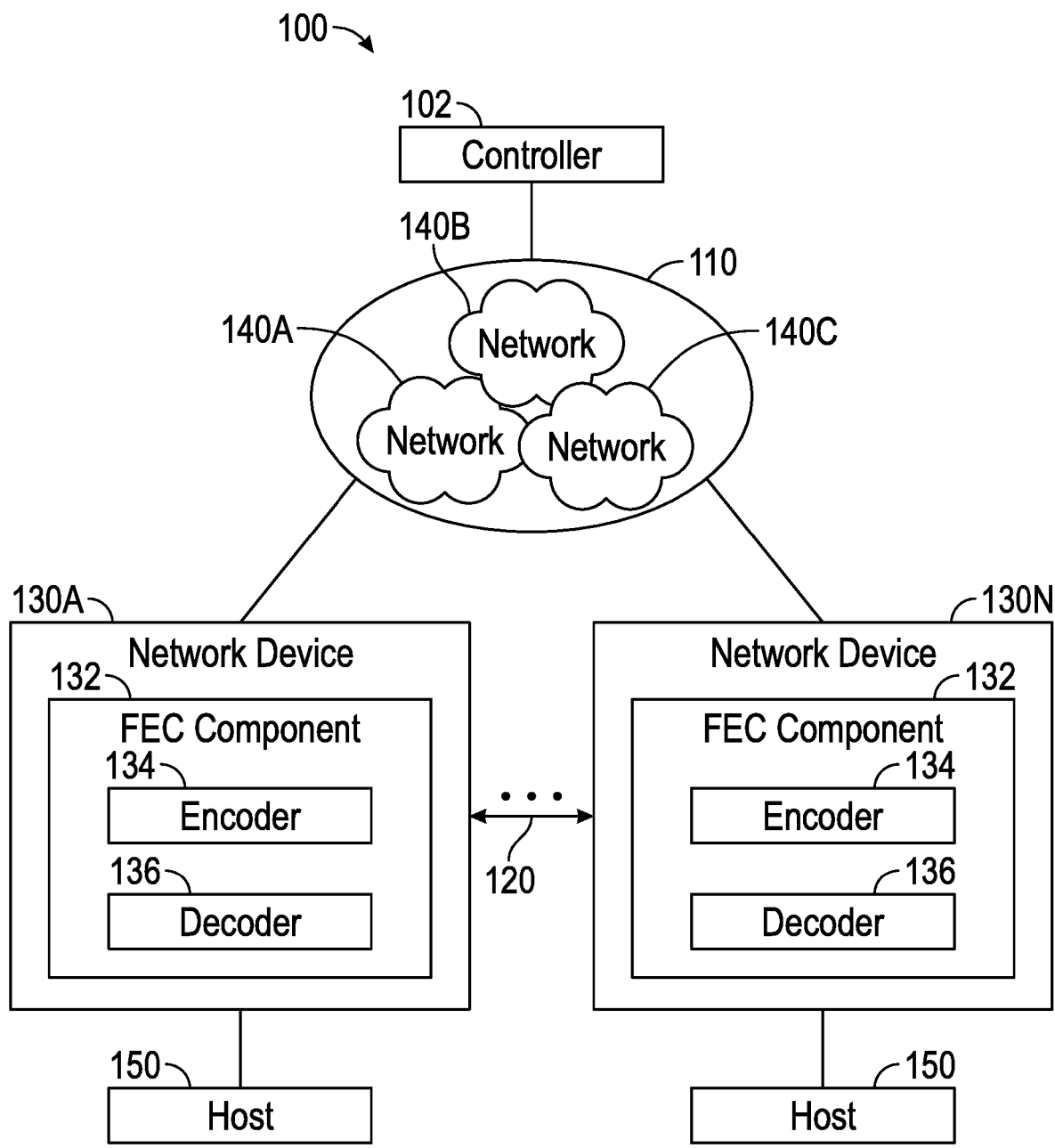
FIG. 1 illustrates an example network architecture, according to one embodiment.

One embodiment presented in this disclosure is a method. The method generally includes receiving a sequence of packets. The method also includes generating a first parity packet for a first group of packets within the sequence of packets, comprising performing an exclusive OR (XOR) operation over a plurality of packets in the first group of packets and at least one packet in a second group of packets. The second group is separated from the first group in the sequence by one or more packets. The method further includes transmitting the first group of packets and the first parity packet.

Another embodiment presented in this disclosure is a network device. The network device generally includes a processor and a memory. The memory contains a program that, when executed by the processor performs an operation. The operation includes receiving a sequence of packets. The operation also includes generating a first parity packet for a first group of packets within the sequence of packets, comprising performing an exclusive OR (XOR) operation over a plurality of packets in the first group of packets and at least one packet in a second group of packets. The second group is separated from the first group in the sequence by one or more packets. The operation further includes transmitting the first group of packets and the first parity packet.

Another embodiment presented in this disclosure is a non-transitory computer-readable storage medium. The non-transitory computer-readable storage medium has computer executable code stored thereon and is executable by one or more processors to perform an operation. The operation includes receiving a sequence of packets. The operation also includes generating a first parity packet for a first group of packets within the sequence of packets, comprising performing an exclusive OR (XOR) operation over a plurality of packets in the first group of packets and at least one packet in a second group of packets. The second group is separated from the first group in the sequence by one or more packets. The operation further includes transmitting the first group of packets and the first parity packet.

EXAMPLE EMBODIMENTS

In general, employing FEC codes in an SD-WAN environment can be time and resource intensive, and may impact communication performance and quality (e.g., packet drops above a threshold) within the SD-WAN. Many FEC codes generally employ Exclusive OR (XOR) operations to address the computational intensiveness associated with operating at high line speeds in such environments. However, conventional FEC codes based on XOR are generally not sufficient to achieve the performance necessary for SD-WAN.

For example, the Hamming code is an XOR (binary) code that can correct any three erasures with three XOR parity packets for every four data packets. However, this code is not generalizable to FEC overheads other than 75% and data block size other than four. In another example, low-density parity check (LDPC) and Turbo codes are XOR codes that are based on "sparse" or "low-density" constructions (where each parity unit is computed from only a few, often random, original data units) and can admit different FEC overheads and block sizes. However, these codes generally require large data block sizes, typically on the order of thousands to tens of thousands to function well. As a result, they are not typically applicable to packets and streaming applications. In another example, interleaving parity can be used to support burst protection on small block sizes, however its performance for isolated losses is poor. For example, for a single loss, the recovery delay can be large, on the order of the whole block size. For losses of two random packets, the recover leads to non-negligible residual losses. Other traditional FEC codes typically employ operations in relatively large finite fields (e.g., GF(256)) and cannot be implemented using simple XOR computations in order to meet the low-computational constraint associated with protecting packets over SD-WAN connections.

Given the associated computational constraints per packet for operating at high line speeds (e.g., there should be a low computational requirement and low delay or latency), embodiments herein use only XOR operations over a relatively small window (e.g., ten to forty) of packets for FEC over SD-WAN. Also, to address packet loss patterns that may include a combination of periods of isolated drops and some periods of burst drops, embodiments provide an effective FEC code for SD-WAN that supports XOR operations over short windows of packets that works for both isolated and burst losses.

FIG. 1 illustrates a network architecture 100, according to embodiments of the present disclosure. In one embodiment, the illustrated network architecture 100 is a SDN-WAN with a decoupled data plane and a control plane. Although not shown, in some embodiments, the network architecture 100 may also include a decoupled management plane and a decoupled orchestration plane.

Here, the network architecture 100 includes network devices 130 A-N interconnected with a controller 102 via a SDN-WAN fabric 110. The SDN-WAN fabric 110 includes one or more networks 140 A-C that can employ various types of communication networks. For example, in one embodiment, network 140A may be the Internet, network 140B may support cellular communications (e.g., 4G, LTE, etc.), and network 140C may support Multiprotocol Label Switching (MPLS). Note, however, that these are merely reference examples, and that other types of communication technologies can be used within the SDN-WAN fabric 110.

The network devices 130 are deployed in a data plane of the network architecture 100 and are generally representative of switches, routers, etc. In one particular embodiment, the network devices 130 are WAN edge routers. The network devices 130 are generally responsible for establishing the SDN-WAN fabric 110 and forwarding traffic (e.g., from tenants). For example, the network devices 130 may form tunnels (e.g., Internet Protocol Security (IPSec) tunnels) with each other to form an SD-WAN overlay. The network devices 130 may exchange data information with each other via the SDN-WAN fabric 110 and/or via an interface 120.

The controller 102, which is deployed in a control plane of the network architecture 100, is generally responsible for providing configuration, provisioning, and routing information (collectively referred to herein as management or control plane traffic) to each of the network devices 130. In addition to the controller 102, the network architecture 100 may also serve as a platform for other services that are performed for tenants. For example, through the use of the central controller, third party services may be integrated for, but not limited to, advanced security, load balancing, and monitoring. A control channel (not shown) may be established between the network devices 130 and the controller 102 for exchange of control plane traffic.

The network devices 130 may be located at different geographic locations from one another (e.g., are remotely located). Each network device 130 may be associated with a site (e.g., facility, office building, campus, data center) that includes one or more hosts (or host devices) 150. The hosts 150 may provide services or clients for various tenants of the network architecture 100. Note that although one host 150 is illustrated in FIG. 1 for each network device 130, it will be appreciated that the network architecture 100 may include a plurality of hosts 150.

Each network device 130 includes a FEC component 132, which is configured to implement one or more of the techniques described herein. The FEC component 132 includes an encoder 134 and a decoder 136. In embodiments herein, a transmitting network device 130 (e.g., network device 130A) can receive one or more source packets (also referred to herein as data packets, data payload, etc.) from a data source (e.g., host 150). In general, a source packet may refer to a unit of data that is configured to traverse a communication channel. For example, a source packet can include audio information (data), video information (data), etc.

The transmitting network device 130 may use encoder 134 to encode the source packet(s) in order to generate an encoded data stream. The encoder 134 can be configured to perform the encoding based on various FEC codes, including, for example, different types of block codes and different types of convolution codes. In one embodiment, the encoded data stream may include the source packet(s) and one or more parity packets. The encoded data stream may be sent to a receiving network device (e.g., network device 130B) via the SDN-WAN fabric 110 and/or via the interface 120. The receiving network device 130 may receive the encoded data stream and use the decoder 136 to decode the encoded data stream in order to obtain the source packet(s). In one embodiment, the receiving network device 130 may use the parity packet(s) of the encoded data stream to recover and/or reconstruct source packet(s) that may have been lost and/or corrupted during transmission.

Note that the network architecture 100 can be representative of a variety of different types of network environments and is provided merely as a reference example of a communication system in which the techniques presented herein may be implemented. For example, the network architecture 100 can be representative of a single tenant network (e.g., a company or organization) with multiple users, a multi-tenant network (e.g., multiple organizations) spread across multiple locations, etc. In general, the techniques presented herein can be implemented in any communication system in which one or more nodes use a series of interconnected communication paths (wired or wireless) to receive and transmit packets of information. For example, the techniques presented herein can be implemented in an environment with a single user running multiple applications. In another example, the techniques presented herein can be implemented in an environment with a single application with multiple flows exchanged via a network.

Figure 2:
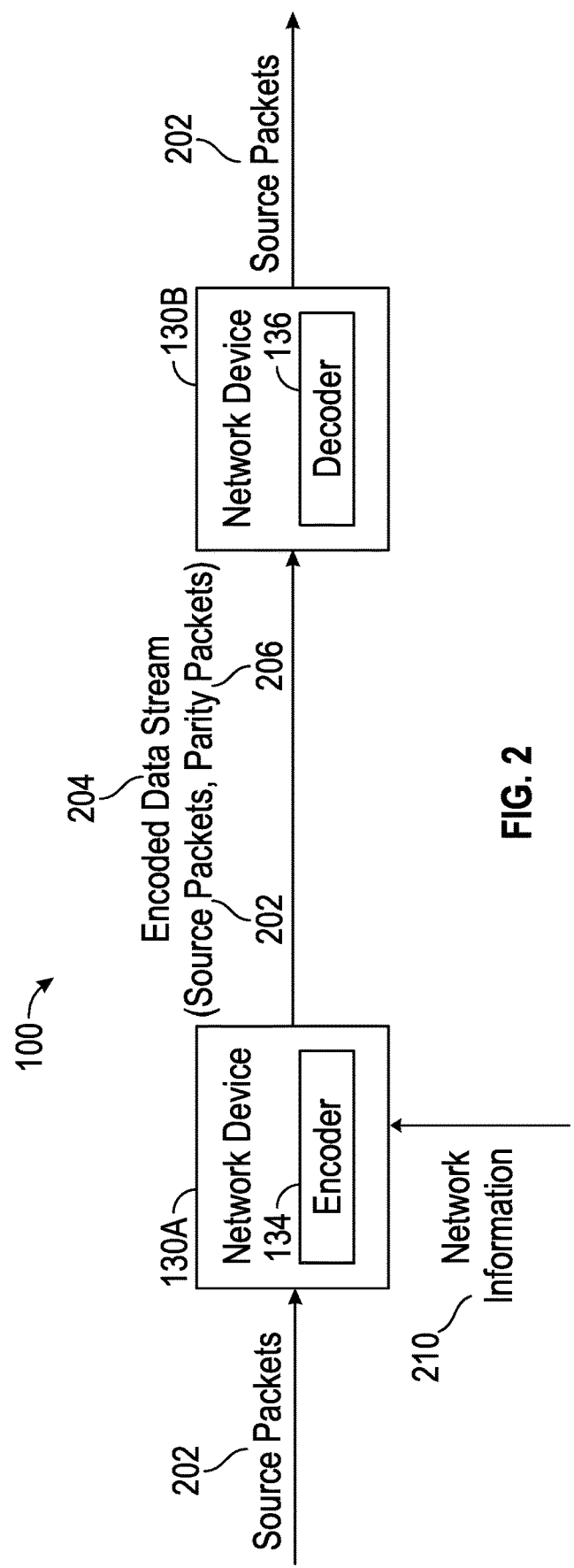
FIG. 2 illustrates a transmitting network device and a receiving network device in the network architecture depicted in FIG. 1, according to one embodiment.

FIG. 2 is a block diagram of a transmitting network device and a receiving network device that may be deployed in the network architecture 100 illustrated in FIG. 1, according to one embodiment. In this particular example, the network device 130A is a transmitter and the network device 130B is a receiver. The network device 130A receives one or more source packets 202 from a data source (e.g., host 150). In some embodiments, the source packets 202 may be a stream of source packets in the form of an ordered sequence of successive source packets s: $\{s_0, s_1, s_2, \ldots\}$, where subscript i of each source packet $s_i$ indicates a successively increasing incremental time or sequence number relative to the previous subscript. In one particular embodiment, the source packets 202 may include audio packets including audio data, video packets including video data, or packets that include other forms of multimedia data. In general, however, the source packets 202 may include a mixture of different types of packets (e.g., audio, video, etc.). These source packets 202 may be received from different end users and applications and may arrive at the network device 130A in some particular order.

The encoder 134 encodes source packets 202 that are received by the network device 130A into an encoded data stream 204. In one embodiment, the encoded data stream 204 (also referred to encoded packets or channel packets) may include the source packets 202 and one or more parity packets 206. In one particular example, the encoded data stream 204 may be represented as an ordered sequence of successive channel packets x: $\{x_1, x_2, x_3, x_4, \ldots\}$, where each channel packet $x_i$ includes a set of source packets 202 and a parity packet 206. That is, each parity packet 206 generated by the encoder 134 may correspond to one or more source packets 202. In one embodiment, the encoder 134 may combine each set of source packets 202 with the corresponding parity packet 206 into a single corresponding channel packet $x_i$, and transmit each channel packet to the network device 130B. In another embodiment, the encoder 134 may transmit each set of source packets 202 separately from its corresponding parity packet 206. The set of source packets 202 within a given channel packet may be contiguous (e.g., $s_0$, $s_1$, and $s_2$) or non-contiguous (e.g., $s_0$, $s_1$, $s_5$).

The network device 130A transmits the encoded data stream 204, which includes the source packets 202 and one or more parity packets 206, to the network device 130B over a wired and/or wireless communication channel, which may traverse one or more communication networks. The decoder 136 of the network device 130B may receive at least some of the encoded data stream 204 and recovers (or attempts to recover) source packets 202 from the received encoded data stream 204. The decoder 136 may use parity packets 206 in the encoded data stream 204 to assist in recovering any source packets 202 that were lost during their transmission over the communication channel. As shown, after decoding the encoded data stream 204, the decoder 136 can recover source packets 202.

Figure 3:
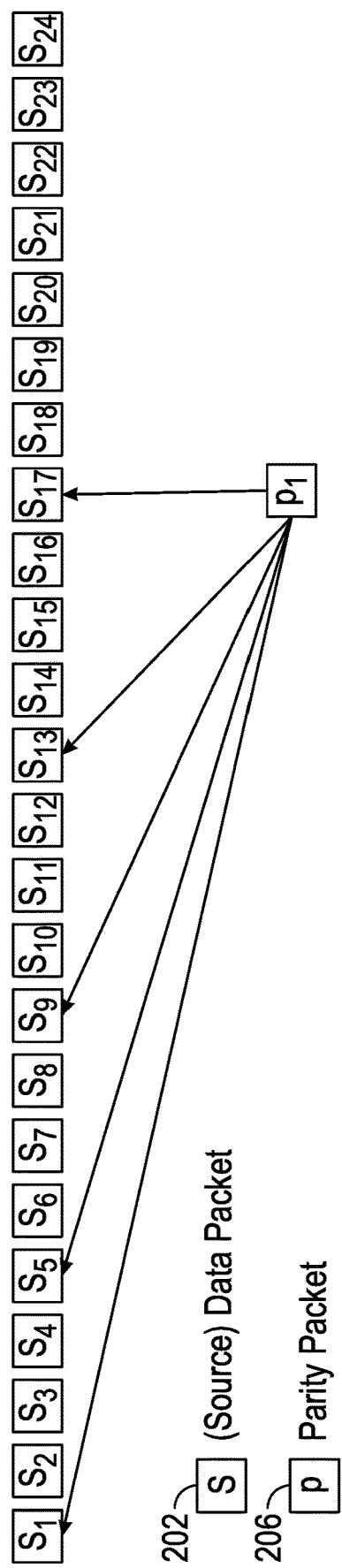
FIG. 3 illustrates an example of generating a parity packet, according to one embodiment.

In embodiments described herein, the encoder can use an XOR-based FEC code to generate the parity packets 206. FIG. 3, for example, shows a sequence of (source) data packets 202 ($s_1$-$s_{24}$) that may be received by the encoder 134. Here, the encoder may generate a parity packet 206 ($p_1$) by performing an XOR operation over five data packets 202 ($s_1$, $s_5$, $s_9$, $s_{13}$, and $s_{17}$) that are each spaced four apart.

Figure 4:
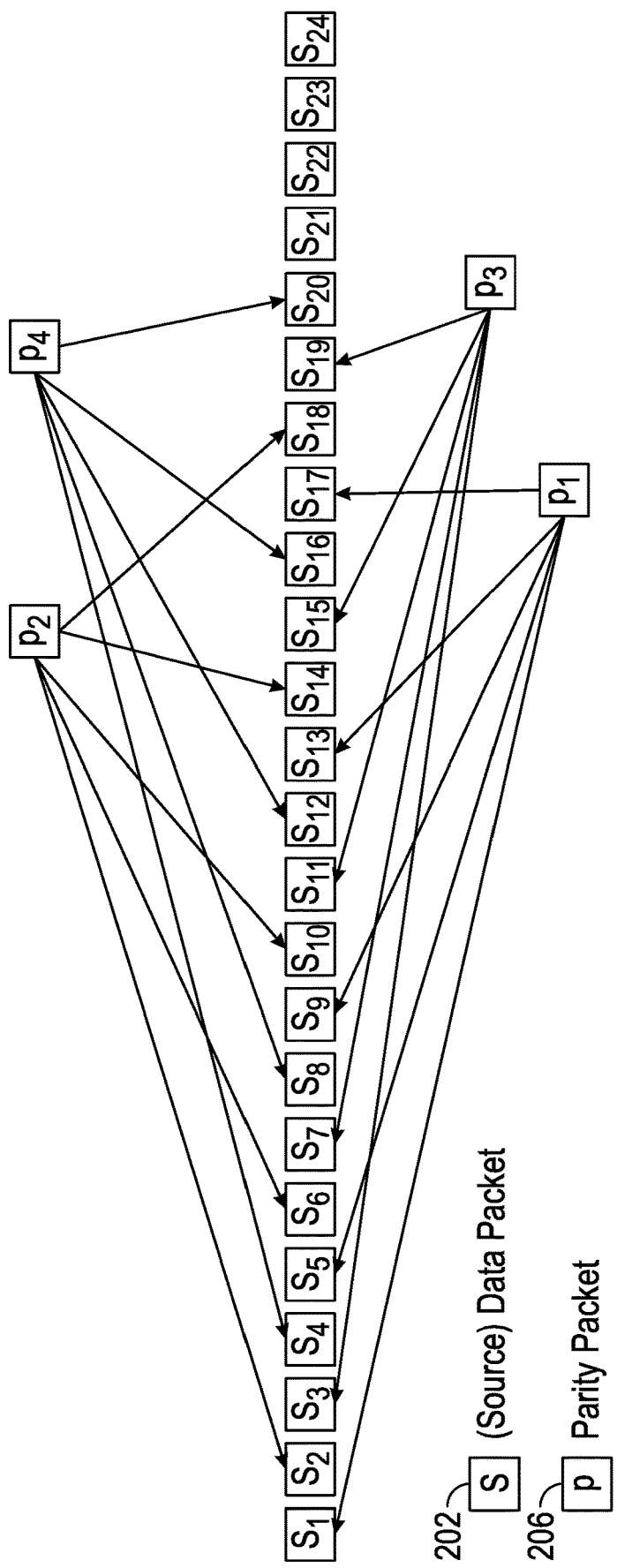
FIG. 4 illustrates another example of generating a parity packet, according to one embodiment.

In some embodiments, the encoder 134 can extend the protection of the XOR-based FEC code to other data packets by repeating the XOR pattern. FIG. 4 shows an example of an interleaved XOR code that can be used to generate one or more parity packets, according to one embodiment. Here, each parity packet 206 ($p_i$) may be formed from a set of source packets 202 $\{s_i, s_{i+4}, s_{i+8}, s_{i+12}, s_{i+16}\}$. For example, $p_1$ is generated from $\{s_1, s_5, s_9, s_{13}, s_{17}\}$, $p_2$ is generated from $\{s_2, s_6, s_{10}, s_{14}, s_{18}\}$, $p_3$ is generated from $\{s_3, s_7, s_{11}, s_{15}, s_{19}\}$, and $p_4$ is generated from $\{s_4, s_8, s_{12}, s_{16}, s_{20}\}$. The interleaved XOR FEC code shown in FIG. 4 may be able to recover a burst of a length of four packets. This is because every four consecutive data packets has a distinct parity packet and the parity packet is not sent right after the data packets that it references. However, while the interleaved XOR FEC code can recover a burst of a length of four packets, in some cases, the loss of any two packets may be irrecoverable. For example, because the parity packets $p_2$, $p_3$, and $p_4$, do not reference any data packets that $p_1$ references, the loss of any two packets out of data packets $s_1$, $s_5$, $s_9$, $s_{13}$, and $s_{17}$ and parity packet $p_1$ may be irrecoverable.

To address this, embodiments herein provide an XOR-based FEC code for SD-WAN that provides improved loss recovery relative to traditional XOR-based FEC code, while still preserving the low computational complexity associated with XOR computations. More specifically, rather than clustering parity packets towards the end of a block (e.g., as shown in FIG. 4), embodiments allow parity packets to be spaced over a larger number of packets.

Figure 5:
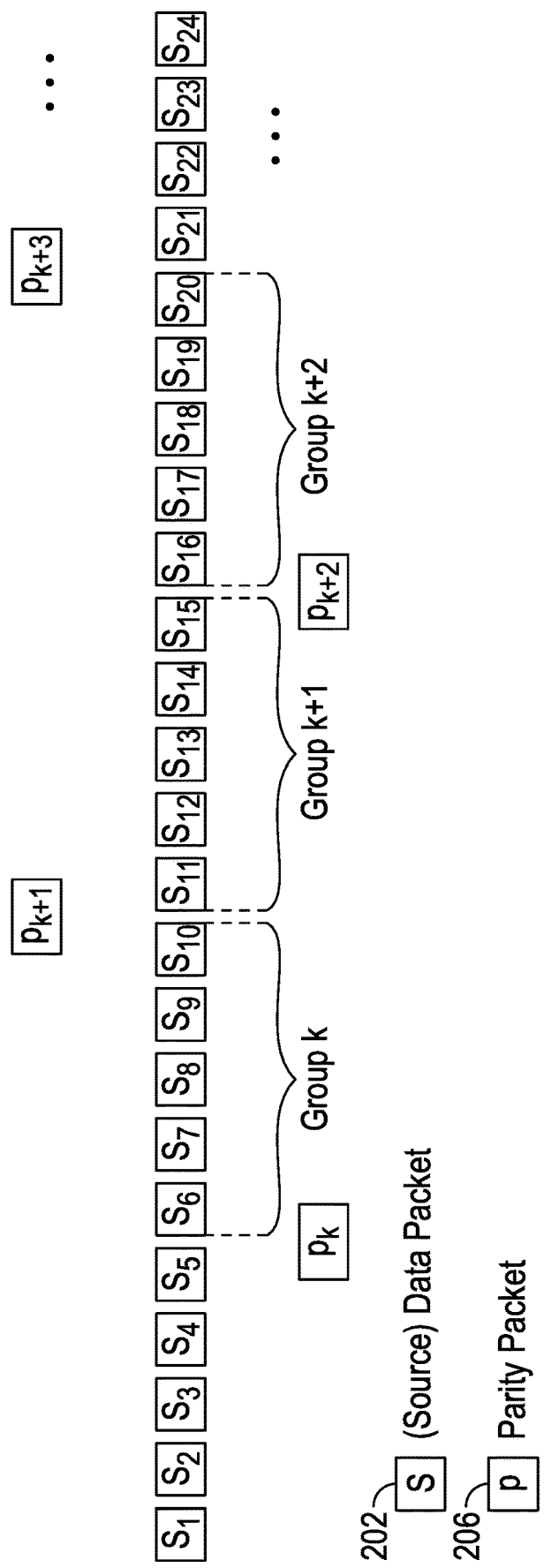
FIG. 5 illustrates yet another example of generating a parity packet, according to one embodiment.

FIG. 5 illustrates an example of forming parity packets for improved loss recovery and low computational complexity, according to one embodiment. In this example, the encoder may generate each parity packet k, such that there is a set of data packets (e.g., Group k) between each two adjacent parity packets (e.g., Group K packets between parity packet k−1 and parity packet k). In one embodiment, the FEC overhead associated with the XOR-based FEC code generated in FIG. 5 may be 1/n, where n denotes the size of each group (e.g., Group k) and corresponds to the spacing between two adjacent parity packets.

Figure 6:
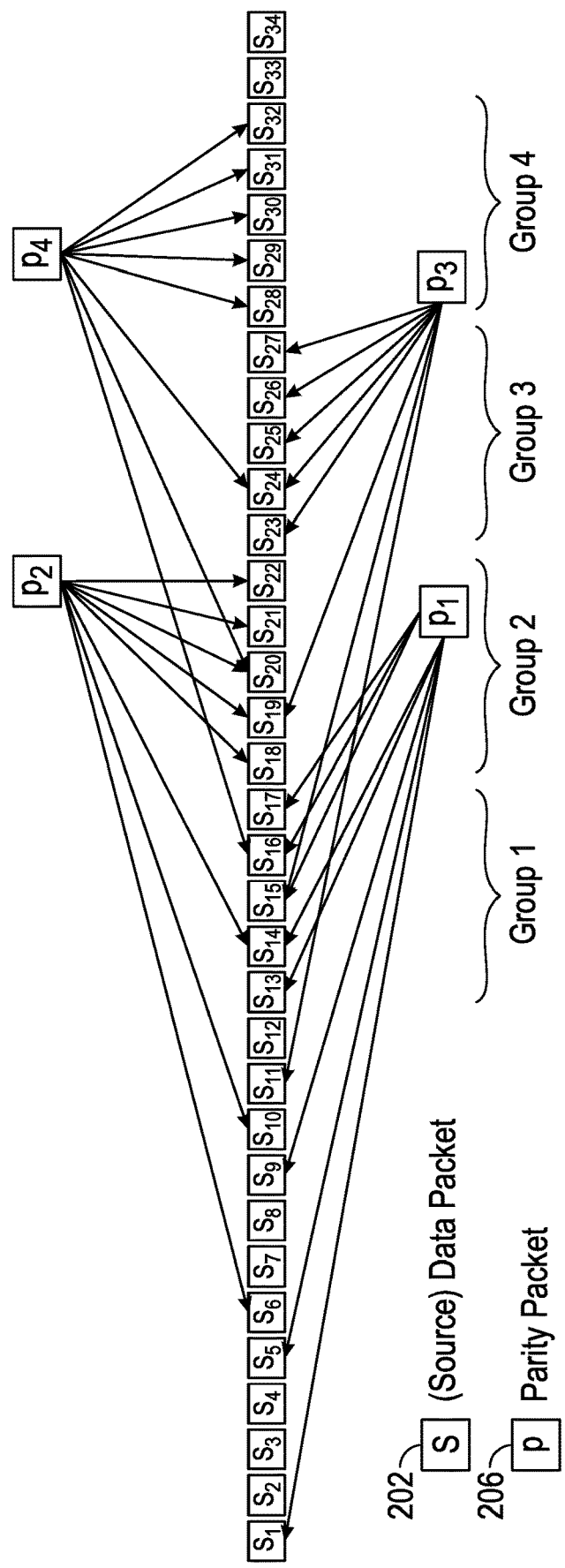
FIG. 6 illustrates an example XOR-based FEC code, according to one embodiment.

In one embodiment, the encoder 134 can form a given parity packet 206 by combining dense local references to recent packets (e.g., $s_{i+N}$) and sparse remote references to older packets (e.g., $s_i$). FIG. 6 illustrates an example XOR-based FEC code where each parity packet k is formed by XOR'ing together all packets in Group k, a single packet in Group k−1, a single packet from Group k−2, and so on. Note that while the embodiment in FIG. 6 illustrates the case where each Group k has five packets and the sparse part of each parity packet is separated by four packets, in some embodiments, the size of each group and/or parity spacing may be different. In general, for a group size g and parity spacing of s, any pair of values of g and s (where g>1 and s>=1) can be chosen, as long as g and s are co-prime.

Figure 7:
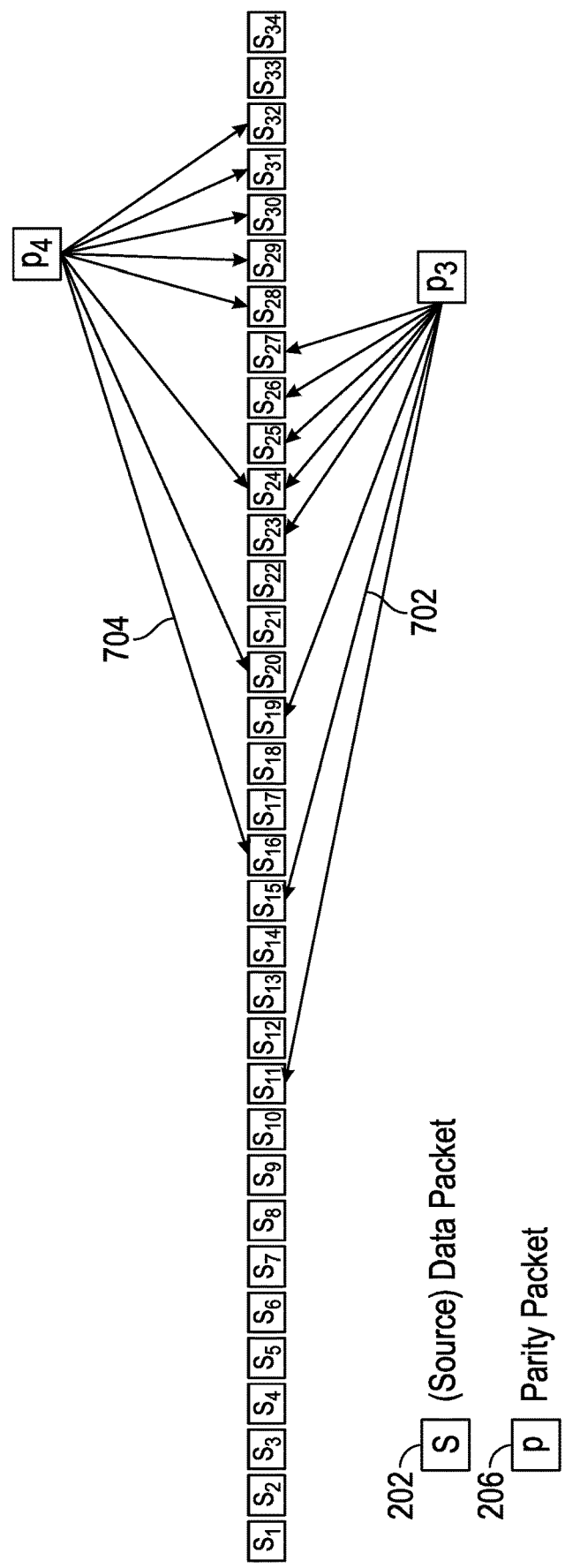
FIG. 7 illustrates an example of forming another XOR-based FEC code, according to one embodiment.

In some embodiments, the structure of the parity packets 206 does not have to be the same for each parity packet 206. FIG. 7, for example, depicts one example of generating an XOR-based FEC code with an irregular structure, according to one embodiment. Here, the XOR-based FEC code with the irregular structure can be obtained by switching the arrows 702 and 704, such that parity packet k XORs data packet $s_{16}$ (instead of XOR'ing data packet $s_{15}$) and that parity packet k1 XORs data packet $s_{15}$ (instead of XOR'ing data packet $s_{16}$). Note, however, that the embodiment depicted in FIG. 7 is merely a reference example and that an irregular XOR-based FEC code can be obtained in other manners. For example, in general, it may be sufficient that each packet in group k is covered by at least one parity packet at a location w, where w>k, and each parity packet w>k protects at most one packet in group k.

In general, embodiments allow the encoder 134 to dynamically adjust the dependency graph (e.g., group sizes and/or parity spacing) based on one or more different types of network information. For example, such information can include, but is not limited to, the current set of packets to be sent, the packet sizes of the current set of packets, packet delivery deadlines (and associated latency available per packet) of the current set of packets, network packet loss characteristics, etc. The network packet loss characteristics, e.g., can be measured at the receiver(s) (e.g., decoder 136) and sent back to the encoder 134. As shown in FIG. 2, in some embodiments, the encoder 134 can receive (and/or determine) the network information 210 and use at least some of the network information 210 for determining how to generate a parity packet 206. As described below, the network information 210 can include information from a receiver (e.g., decoder 136) and/or information determined by the sender (e.g., encoder 134). By enabling the encoder 134 to dynamically adjust the dependency graph, embodiments enable the encoder 134 to dynamically maximize performance (e.g., increase packet loss recovery, reduce FEC overhead, reduce latency, etc.) based on a state of the network.

In some embodiments, the network information 210 may be feedback from the receiver (e.g., decoder 136). For example, the network information 210 can include feedback regarding the received/lost packets (and latency for the received packets). The feedback can be for all of the transmitted packet flows (and associated packets) or a subset of the transmitted packet flows. For example, assuming there are N flows at a given point in time associated with one or more tenants and one or more applications, the feedback can be for the N flows transmitted or a subset of the N flows transmitted (e.g., there may be some packet loss on the return path where some of the feedback is lost). Note, however, that feedback for a subset of the transmitted flows may still allow the encoder 134 to determine the network loss/delay pattern, such that the encoder 134 can dynamically adapt the dependency graph. In general, the feedback from the receiver may be representative of a recent past or previous state (e.g., backwards looking view) of the network.

In some embodiments, the network information 210 can be determined by a sender (e.g., encoder 134). That is, the network information 210 may be based on an estimate or prediction of what the network packet loss/delay pattern may be at a future point in time. In general, this prediction may be representative of the future of the network. Note that the prediction may not be for a time instance that is far in the future. For example, the prediction may be an estimate of the network attributes for the next 10 milliseconds or 100 milliseconds or several seconds (e.g., as opposed to an estimate for the next several minutes).

In some cases, the sender (e.g., encoder 134) itself may perform operations that impact the network loss/delay pattern. In these cases, the sender may leverage knowledge of these operations for predicting the future state of the network. For example, assuming the sender knows that it is going to increase the number of transmitted packets (e.g., due to new flows starting), then the sender may determine that the packet loss/delay rate may increase in the future. In another example, assuming the sender knows that it is going to decrease the number of transmitted packets (e.g., due to one or more flows ending), then the sender may determine that the packet loss/delay rate may decrease in the future. In this manner, the sender may use knowledge of its own operations to make a prediction on how the network characteristics will change in the near future, and therefore, determine how to adjust the dependency graph.

In one particular embodiment, the group sizes and/or the parity spacing can be different between parity packets 206 (e.g., to allow for dynamic adaptation). For example, when the traffic flow includes a few data packets, the encoder 134 can choose to transmit parity packets more frequently. In another example, the span of reference to previous packets can be dynamically adjusted based on the latency requirement imposed by the application. In some cases, for example, the parity packets 206 can refer to a single source packet or two source packets (or any number of source packets) from previous groups when the application demands very low latency (e.g., below a threshold) and can discard late-arriving packets. In some cases, the dependency graph can stretch back to older source packets when the latency requirement is more relaxed.

Further, note that, in general, the size of a parity packet 206 typically has to be at least the largest of the data packets that it is protecting. Because of this, the FEC overhead may be determined, in part, by the number of packets and their lengths. Embodiments allow for dynamically controlling the total FEC overhead by selecting the number of parity packets and keeping their packet sizes small (e.g., below a threshold). For SD-WAN type applications that often interleave multiple sessions with very different packet sizes, embodiments can optimize dependency selections to avoid constantly generating large parity packets. Referring back to FIG. 6, for example, for the parity packet $p_1$, the encoder 134 can determine the maximum size of data packets $s_{13}$, $s_{14}$, $s_{15}$, $s_{16}$, and $s_{17}$. In this example, the encoder 134 may set the maximum size from this set of packets as the smallest size that is used to protect that entire group. Then, when selecting packets from earlier groups, the encoder 134 can bias against selecting packets that are significantly larger than the determined smallest size in order to avoid increasing the size of the parity packet. In this manner, embodiments allow for selecting the size of the parity packet that is smaller than would otherwise be selected in conventional techniques, thereby reducing the total FEC overhead.

In cases where SD-WAN streams include a mixture of application flows with different delay requirements, embodiments can support a faster recovery of select subsets of packets (e.g., audio) without requiring them to arrive in a particular order. In some embodiments, the FEC protection dependency graphs can be adjusted (in real-time) on the fly based on the changing traffic pattern. For example, if there is little traffic the FEC dependency graph can adapt to protect the associated packets while minimizing the FEC overhead and without waiting for additional data packets, thereby leading to lower recovery delay. In some cases, if the packets are of very different sizes (e.g., TCP SYN packets vs. video data packets), the FEC dependency graph can be adapted to provide the desired protection while minimizing the FEC overhead. That is, embodiments can adapt to the changing data packet sizes to continue to provide the desired protection while minimizing the FEC overhead.

Figure 8:
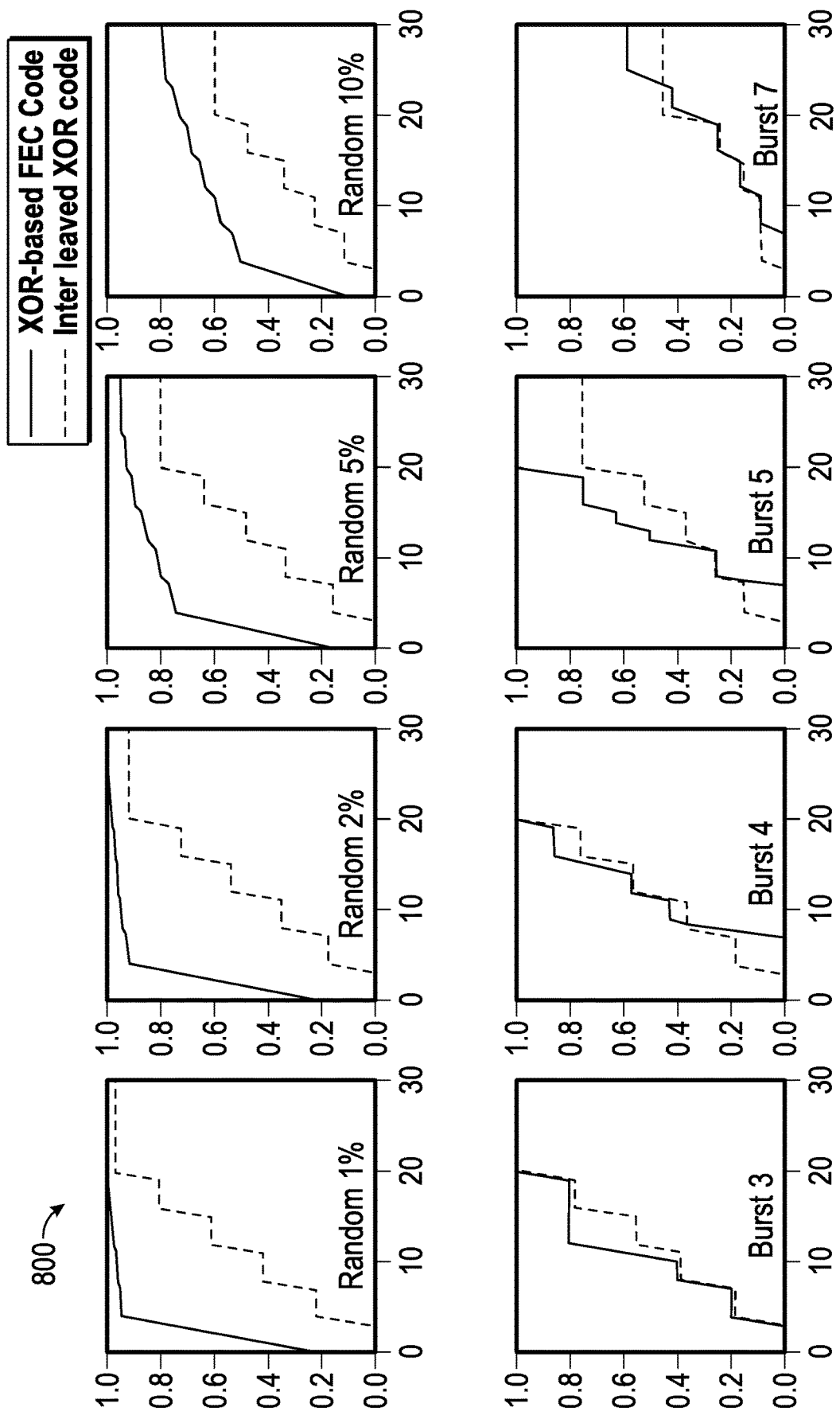
FIG. 8 depicts packet level simulations of an XOR-based FEC code compared to an interleaved XOR code, according to one embodiment.

FIG. 8 depicts packet level simulations 800 of the XOR-based FEC design described herein (e.g., FIG. 6) compared to an interleaved XOR code (e.g., FIG. 4) according to one embodiment. The x-axis in the plots is the decoding deadline (or decoding delay) expressed in the number of data packets. The y-axis in the plots is the cumulative fraction of lost packets recovered. For example, 0.8 of the y-axis indicates that 80% of the lost packets are recovered by the FEC code at the associated decoding deadline expressed on the x-axis. In general, the more decoding delay that is allowed, the larger the fraction of lost packets that can be recovered.

As shown in the packet level simulations 800, when the burst length is at 3 or 4, the XOR-based FEC design described herein can achieve similar performance as the interleaved XOR code. For random losses of 1% and 2%, the XOR-based FEC design can achieve a higher eventual recovery ratio than the interleaved XOR code and is able to recover a higher percentage of lost packets sooner than the interleaved XOR code. For example, the XOR-based FEC design may be able to recover 90% of lost packets with a delay of five packets while the interleaved XOR code recovers 90% of lost packets with a delay of twenty packets.

For random losses at 5% and 10%, the XOR-based FEC design can achieve both a higher recovery ratio and a lower decoding delay. For burst loss lengths of 5 and 7, the XOR-based FEC design can achieve significantly higher recovery rate over the interleaved XOR code, e.g., recovering as much as 20% more of the lost packets compared to the interleaved XOR code at decoding delays of twenty to twenty five packets.

In general, at a given packet decoding delay constraint (e.g., a given point on the x-axis), the XOR-based FEC design described herein can achieve a higher packet loss recovery ratio compared to conventional XOR-based codes. Moreover, to achieve a desired packet loss recovery ratio (e.g., a given point on the y-axis), the XOR-based FEC design can use a lower decoding delay compared to conventional XOR-based codes.

Advantageously, embodiments described herein can achieve a higher efficiency and higher adaptability over conventional FEC codes. For example, embodiments can enable improved loss recovery versus conventional FEC codes while using solely XOR operations on packets. Embodiments can achieve the same packet loss recovery at a lower decoding delay (e.g., faster recovery) and/or can recover from more losses at the same decoding delay (e.g., higher recovery percentage). In some cases, embodiments can adapt in real-time to changes in the observed packet loss patterns. For example, if the network starts to exhibit longer burst lengths, the FEC dependency graph (structure) can be adapted to provide additional protection against longer burst losses.

Figure 9:
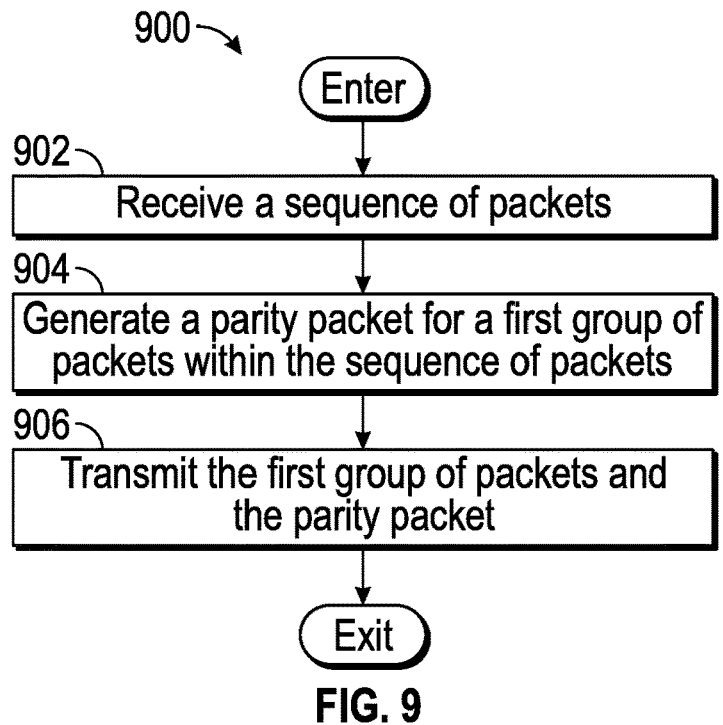
FIG. 9 is a flowchart of a method for encoding a sequence of packets, according to one embodiment.

FIG. 9 is a flowchart of a method 900 for encoding a sequence of packets (e.g., using the XOR-based FEC code described herein), according to one embodiment. The method 900 may be performed by a network device (e.g., network device 130A).

The method 900 may enter at 902, where the network device receives a sequence of packets (e.g., source packets 202). At 904, the network device generates a parity packet (e.g., parity packet k) for a first group of packets (e.g., Group k) within the sequence of packets. In one embodiment, the network device may generate the parity packet by performing an XOR operation over a plurality of packets in the first group of packets and at least one packet in a second group of packets. In one embodiment, the plurality of packets in the first group of packets may be consecutive. The second group of packets may be separated from the first group of packets in the sequence by one or more packets. At 906, the network device may transmit the first group of packets and the parity packet. As described below, the network device may select the particular packets to use within the first group of packets and/or the second group of packets, based on a number of criteria, examples of which include packet size, latency requirements, network state, etc.

Figure 10:
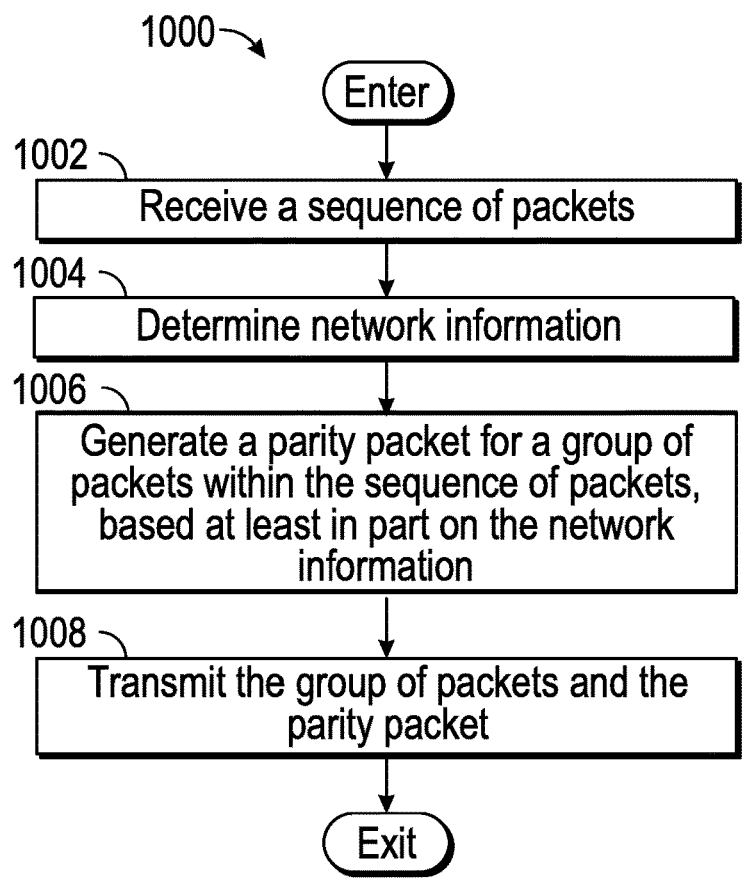
FIG. 10 is a flowchart of another method for encoding a sequence of packets, according to one embodiment.

FIG. 10 is a flowchart of a method 1000 for encoding a sequence of packets (e.g., using the XOR-based FEC code described herein), according to one embodiment. The method 1000 may be performed by a network device (e.g., network device 130A).

The method 1000 may enter at 1002, where the network device receives a sequence of packets (e.g., source packets 202). At 1004, the network device determines network information (e.g., network information 210) associated with the network. As noted, the network information 210 can include information determined by the network device and/or information received by the network device from another network device (e.g., network device 130B).

At 1006, the network device generates a parity packet (e.g., parity packet k) for a group of packets (e.g., Group k) within the sequence of packets, based at least in part on the network information. In one embodiment, the network device may adjust a dependency structure of the parity packet for the group of packets relative to the dependency structure of another parity packet for another group of packets, based on the network information. At 1008, the network device transmits the group of packets and the parity packet.

Figure 11:
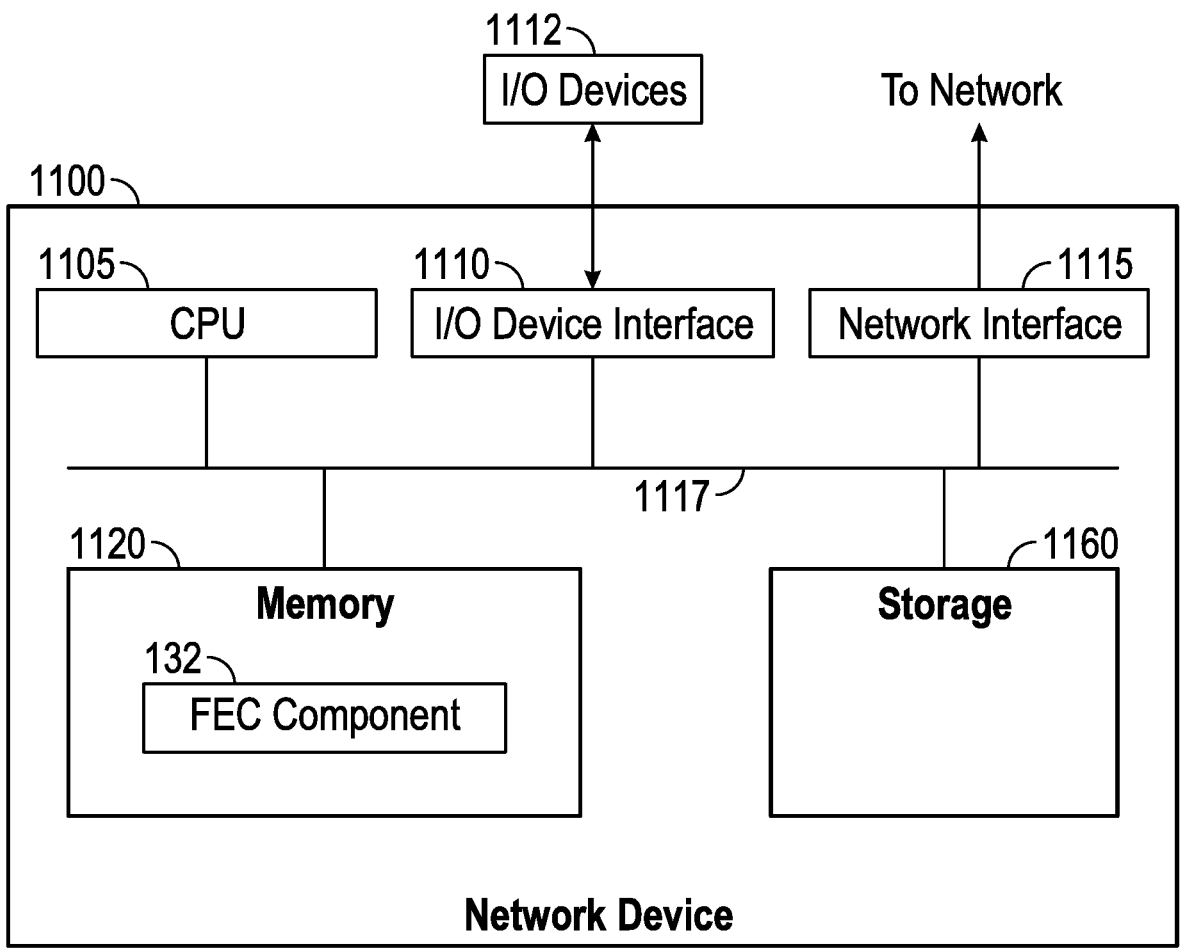
FIG. 11 is a block diagram of an example network device, according to one embodiment.

FIG. 11 illustrates a network device 1100 configured encode a sequence of packets using an XOR-based FEC code, according to one embodiment. As shown, the network device 1100 includes, without limitation, a central processing unit (CPU) 1105, a network interface 1115, a memory 1120, and storage 1160, each connected to a bus 1117. The network device 1100 may also include an I/O device interface 1110 connecting I/O devices 1112 (e.g., keyboard, mouse, and display devices) to the network device 1100. Further, in context of this disclosure, the computing elements shown in the network device 1100 may correspond to a physical computing system (e.g., a system in a data center) or may be a virtual computing instance executing within a computing cloud. In one embodiment, the network device 1100 can be an example of the network device illustrated in FIG. 1 (e.g., network device 130A).

The CPU 1105 retrieves and executes programming instructions stored in the memory 1120 as well as stores and retrieves application data residing in the memory 1120. The interconnect 1117 is used to transmit programming instructions and application data between CPU 1105, I/O devices interface 1110, storage 1160, network interface 1115, and memory 1120. Note CPU 1105 is included to be representative of a single CPU, multiple CPUs, a single CPU having multiple processing cores, and the like. Memory 1120 is generally included to be representative of a random access memory. The storage 1160 may be a disk drive storage device. Although shown as a single unit, storage 1060 may be a combination of fixed and/or removable storage devices, such as fixed disc drives, removable memory cards, or optical storage, network attached storage (NAS), or a storage area-network (SAN). Illustratively, the memory 1120 includes the FEC component 132, which is described in more detail above.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:
1. A computer-implemented method comprising:
receiving a sequence of packets;
generating a first parity packet for a first group of packets within the sequence of packets, comprising performing an exclusive OR (XOR) operation over a plurality of packets in the first group of packets and at least one packet in a second group of packets, the second group being separated from the first group in the sequence by a first one or more packets, wherein the first group of packets, the second group of packets, and the first one or more packets lack any same packet; and
transmitting the first group of packets and the first parity packet.

2. The computer-implemented method of claim 1, wherein:
the first group of packets is received prior to the second group of packets; and
the first group of packets is adjacent to the second group of packets in the sequence of packets.

3. The computer-implemented method of claim 1, further comprising:
generating a second parity packet for the second group of packets, comprising performing an XOR operation over a plurality of packets in the second group of packets and at least one packet in a third group of packets, the third group being separated from the second group in the sequence by a second one or more packets; and
transmitting the second group of packets and the second parity packet.

4. The computer-implemented method of claim 3, wherein:
the second group of packets is received prior to the third group of packets; and
the second group of packets is adjacent to the third group of packets in the sequence of packets.

5. The computer-implemented method of claim 4, wherein generating the first parity packet further comprises performing the XOR operation over at least one packet in the third group of packets.

6. The computer-implemented method of claim 3, wherein:
the first group of packets has a first size equal to a number of packets in the first group of packets; and
the second group of packets has a second size equal to a number of packets in the second group of packets.

7. The computer-implemented method of claim 6, wherein the first size is equal to the second size.

8. The computer-implemented method of claim 6, wherein the first size is different from the second size.

9. The computer-implemented method of claim 1, wherein generating the first parity packet further comprises determining a number of groups of packets within the sequence of packets to use for the XOR operation, based at least in part on one or more network characteristics.

10. The computer-implemented method of claim 9, wherein the one or more network characteristics comprises a network characteristic predicted by a network device based on one or more operations of the network device, wherein the predicted network characteristic indicates a future network state.

11. The computer-implemented method of claim 9, wherein the one or more network characteristics comprises one or more attributes associated with the first group of packets.

12. The computer-implemented method of claim 9, wherein the one or more network characteristics comprises a current traffic pattern comprising a plurality of application flows and wherein a first of the plurality of application flows has a first delay requirement and a second of the plurality of application flows has a second different delay requirement.

13. A network device comprising:
one or more memories collectively storing computer-executable instructions; and
one or more processors coupled to the one or more memories, the one or more processors being collectively configured to execute the computer-executable instructions to cause the network device to perform an operation comprising:
receiving a sequence of packets;
generating a first parity packet for a first group of packets within the sequence of packets, comprising performing an exclusive OR (XOR) operation over a plurality of packets in the first group of packets and at least one packet in a second group of packets, the second group being separated from the first group in the sequence by a first one or more packets, wherein the first group of packets, the second group of packets, and the first one or more packets lack any same packet; and
transmitting the first group of packets and the first parity packet.

14. The network device of claim 13, wherein:
the first group of packets is received prior to the second group of packets; and
the first group of packets is adjacent to the second group of packets in the sequence of packets.

15. The network device of claim 13, the operation further comprising:
generating a second parity packet for the second group of packets, comprising performing an XOR operation over a plurality of packets in the second group of packets and at least one packet in a third group of packets, the third group being separated from the second group in the sequence by a second one or more packets; and
transmitting the second group of packets and the second parity packet.

16. The network device of claim 15, wherein:
the second group of packets is received prior to the third group of packets; and
the second group of packets is adjacent to the third group of packets in the sequence of packets.

17. The network device of claim 16, wherein generating the first parity packet further comprises performing the XOR operation over at least one packet in the third group of packets.

18. The network device of claim 13, wherein generating the first parity packet further comprises determining a number of groups of packets within the sequence of packets to use for the XOR operation, based at least in part on one or more network characteristics.

19. A non-transitory computer readable storage medium having computer-executable code stored thereon, the computer-executable code being executable by one or more processors to perform an operation comprising:
receiving a sequence of packets;
generating a first parity packet for a first group of packets within the sequence of packets, comprising performing an exclusive OR (XOR) operation over a plurality of packets in the first group of packets and at least one packet in a second group of packets, the second group being separated from the first group in the sequence by a first one or more packets, wherein the first group of packets, the second group of packets, and the first one or more packets lack any same packet; and
transmitting the first group of packets and the first parity packet.

20. The computer-implemented method of claim 1, wherein a number of packets within each of (i) the first group of packets, (ii) the second group of packets, and (iii) the first one or more packets is determined based at least in part on one or more network characteristics.

* * * * *